(12) United States Patent
Ganesan et al.

(10) Patent No.: US 7,705,447 B2
(45) Date of Patent: Apr. 27, 2010

(54) INPUT/OUTPUT PACKAGE ARCHITECTURES, AND METHODS OF USING SAME

(75) Inventors: Sanka Ganesan, Chandler, AZ (US); Kemal Aygun, Chandler, AZ (US); Chandrashekhar Ramaswamy, Chandler, AZ (US); Eric Palmer, Tempe, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/286,212

(22) Filed: Sep. 29, 2008

(65) Prior Publication Data
US 2010/0078781 A1    Apr. 1, 2010

(51) Int. Cl.
*H01L 23/34* (2006.01)
*H01L 23/495* (2006.01)
*H01L 23/10* (2006.01)
*H01L 23/28* (2006.01)

(52) U.S. Cl. .............. 257/713; 257/675; 257/706; 257/707; 257/712; 257/796; 257/E23.051; 257/E23.101; 257/E23.105

(58) Field of Classification Search .............. 257/675, 257/706–707, 796, E23.051, E23.101, E23.105, 257/712–713
See application file for complete search history.

(56) References Cited

U.S. PATENT DOCUMENTS

| | | | |
|---|---|---|---|
| 5,973,927 A * | 10/1999 | Tanaka | 361/760 |
| 6,184,580 B1 * | 2/2001 | Lin | 257/712 |
| 6,229,702 B1 * | 5/2001 | Tao et al. | 361/704 |
| 6,512,675 B1 * | 1/2003 | Tarter et al. | 361/714 |
| 6,528,876 B2 * | 3/2003 | Huang | 257/706 |
| 6,919,631 B1 * | 7/2005 | Hoffman et al. | 257/707 |
| 7,075,180 B2 * | 7/2006 | Narendra et al. | 257/707 |
| 7,196,414 B2 * | 3/2007 | Lin et al. | 257/707 |
| 7,361,985 B2 * | 4/2008 | Yuan et al. | 257/713 |
| 7,446,408 B2 * | 11/2008 | Shim et al. | 257/706 |

(Continued)

OTHER PUBLICATIONS

H. Braunisch, J. E. Jaussi, J. A. Mix, M. B. Trobough, B. D. Horine, V. Prokofiev, D. Lu, R. Baskaran, P. C. H. Meier, D.-H. Han, K. E. Mallory, and M. W. Leddige, "Flex-circuit chip-to-chip interconnects," in Proc. IEEE Electronic Comp. Technol. Conf. (ECTC), San Diego, CA, May 30-Jun. 2, 2006, pp. 1853-1859.

(Continued)

*Primary Examiner*—Ida M Soward
(74) *Attorney, Agent, or Firm*—John N. Greaves

(57) ABSTRACT

A high-speed I/O trace is part of an I/O package architecture for an integrated circuit package substrate. The integrated circuit package substrate includes an integrated heat spreader footprint on a die-side and the I/O trace to couple with an IC device to be disposed inside the IHS footprint. The I/O trace includes a pin-out terminal outside the IHS footprint to couple to an IC device to be disposed outside the IHS footprint. The high-speed I/O trace can sustain a data flow rate from a processor in a range from 5 gigabits per second (Gb/s) to 40 Gb/s.

35 Claims, 9 Drawing Sheets

U.S. PATENT DOCUMENTS

| | | | |
|---|---|---|---|
| 2003/0092221 A1* | 5/2003 | Huang et al. | 438/122 |
| 2005/0051894 A1* | 3/2005 | Kim et al. | 257/734 |
| 2005/0093120 A1* | 5/2005 | Millik et al. | 257/678 |
| 2005/0211749 A1* | 9/2005 | Hu et al. | 228/180.22 |
| 2007/0013080 A1* | 1/2007 | DiBene et al. | 257/777 |
| 2008/0002365 A1* | 1/2008 | Gupta | 361/700 |
| 2008/0073776 A1* | 3/2008 | Suh et al. | 257/706 |
| 2008/0150125 A1* | 6/2008 | Braunisch et al. | 257/712 |
| 2008/0157350 A1* | 7/2008 | Cheah et al. | 257/713 |
| 2008/0237843 A1* | 10/2008 | Gupta et al. | 257/713 |
| 2009/0039482 A1* | 2/2009 | He et al. | 257/675 |
| 2009/0279255 A1* | 11/2009 | Sauciuc et al. | 361/697 |

OTHER PUBLICATIONS

H. Braunisch, J. E. Jaussi, and J. A. Mix, "High-speed flex chip-to-chip interconnect," in Proc. IEEE 15th Topical Meeting Electrical Perf. Electronic Packaging (EPEP), Scottsdale, AZ, Oct. 23-25, 2006, pp. 273-276.

K. Grundy, H.-J. Liaw, G. Otonari, and M. Resso, "Designing scalable 10G backplane interconnect systems utilizing advanced verification methodologies," in Proc. DesignCon, Santa Clara, CA, Feb. 6-9, 2006, 20 pages.

* cited by examiner

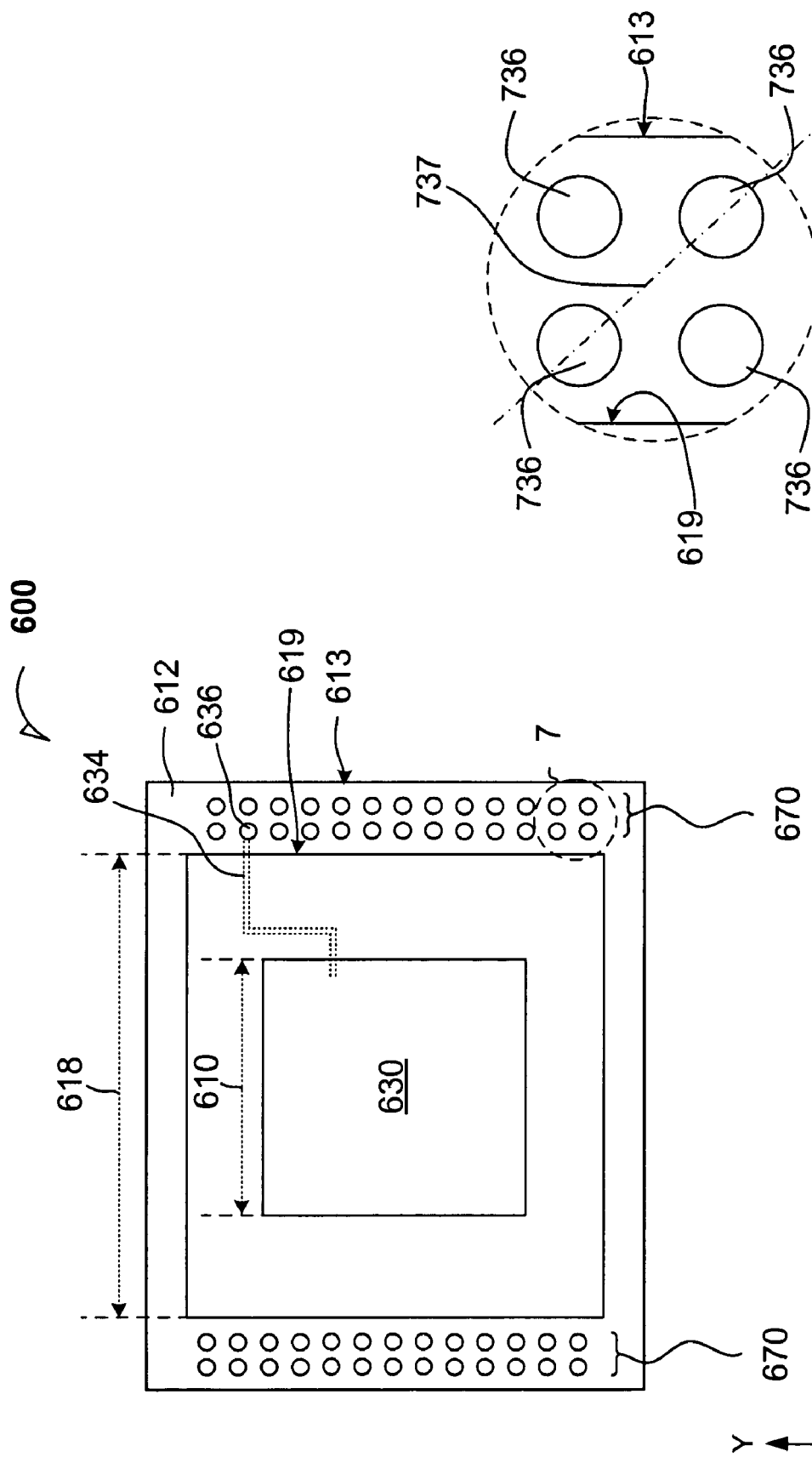

INPUT/OUTPUT PACKAGE ARCHITECTURES, AND METHODS OF USING SAME

TECHNICAL FIELD

Disclosed embodiments relate to mounting substrates for processors and input/output configurations therefor.

BACKGROUND

As Si technology continues to scale following Moore's law, multi-core and many-core processors are going to be common in high performance server market segments. These processors need increased processor-to-processor (or I/O hub) and processor-to-memory bandwidth to make optimal use of the huge computing power of the multi- or many-cores. The Input/Output (I/O) bandwidth (given by number of I/O pins times data flow rate) can be increased by either increasing the number of pins or data rate or both. Both of these options for increasing bandwidth usually tend to drive up the cost. Increasing number of I/O pins causes Si, package, and socket size growth. A larger socket takes more board space and in certain cases also increases the board layer count. Increasing data rate to improve bandwidth on the other hand is confronted by technological challenges and the corresponding cost impact. Signal integrity (SI) issues due to signal reflections and crosstalk associated with package, socket, and board vertical transitions impose severe constraints on the maximum achievable signaling speed in an interconnect system. Even though various known techniques such as voiding of package planes around plated-through-hole (PTH) vias, decreasing the size of the PTHs (and in some cases eliminating PTHs in package substrate), back-drilling of board vias, and crosstalk reduction by placing sufficient ground pins in the socket/connector exist to mitigate some of the these SI issues, cost and high-volume manufacturing (HVM) reliability limit the extent of applicability of these methods for products.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 6a is a top plan of an integrated circuit package substrate according to an example embodiment;

FIG. 7 is a top plan detail taken from the section line 7 depicted in FIG. 6a according to an example embodiment;

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Figure 1A:
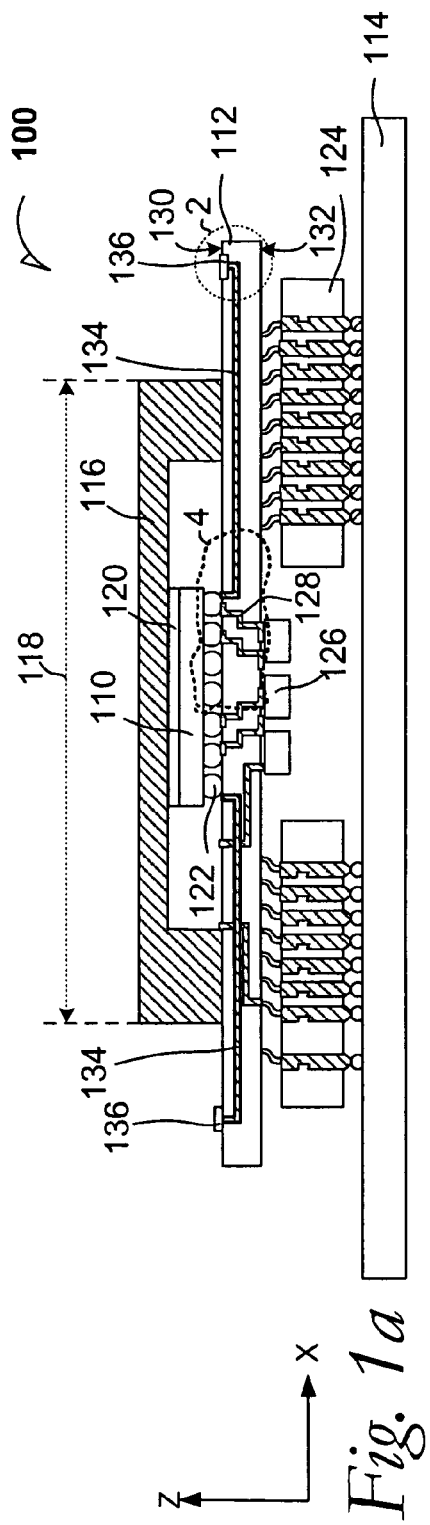
FIG. 1a is a cross-section elevation of an integrated circuit device package according to an example embodiment.

FIG. 1a is a cross-section elevation of an integrated circuit device package 100 according to an example embodiment. The package 100 includes at least one integrated circuit (IC) device 110 such as a processor or a processor and a memory device. The IC device 110 is disposed on an IC package substrate 112, and the IC package substrate 112 is disposed on a board 114 such as a motherboard. The IC device package 100 may also be referred to as a high-density package that allows for high-speed input/output (I/O) communication that can exceed 10 gigabit per second (Gb/s) signaling rate. A high-speed I/O signaling rate may allow for fewer I/O pin-out contacts that may allow a package to be smaller than otherwise limited. In an embodiment, the IC package substrate 112 is a processor package substrate 112. In another embodiment, the IC package substrate 112 is a processor plus memory device package substrate 112. The memory device may be a three-dimensional (3D) memory chip stack. The processor plus memory device package substrate 112 can provide a fast (e.g., 3 to 8 gigatransfers per second (GT/s)) interconnection between the processor and the memory device. For such a memory device, storage capacity may be configured between 1 and 8 gigabytes (GB) although larger or smaller configurations that are being practiced are also to be employed.

The IC device 110 is thermally coupled to a heat spreader 116, which may be referred to as an integrated heat spreader (IHS) 116 that exhibits an IHS footprint 118 as seen along the X-dimension in FIG. 1a. The IC device 110 is bonded to the IHS 116 through a thermal interface material (TIM) 120 where the backside of the IC device 110 contacts the TIM 120. In an embodiment, the IC device 110 is electronically coupled at the active surface thereof to the IC package substrate 112 through a series of electrical bumps 122 that may be microballs 122 or solder bumps 122. The IC package substrate 112 is electronically coupled to the board 114 through a socket 124 according to an embodiment.

The IC device 110 may be configured with several capacitors to assist in transient load disturbances that are imposed upon the IC device 110 during routine use. In an embodiment, at least one land-side capacitor (LSC) 126 is disposed on the IC package substrate 112 between the IC package substrate 112 and the board 114 and directly below the IC device. Electronic communication between the LSC 126 and the IC device 110 is carried out with capacitor interconnects, one of which is indicated with the reference numeral 128.

The IC package substrate 112 includes a top side 130 (also referred to as a die side 130) and a bottom side 132 (also referred to as a land side 132). High speed I/O communication is carried out by high-speed I/O traces, two of which are indicated with reference numeral 134. The high-speed I/O trace 134 is pinned out at a terminal 136 that is located outside the IHS footprint 118 and it is pinned out on the die side 130 of the IC package substrate 112. In an embodiment, the high-speed I/O trace 134 is formed from a single metallic body such as an integral metal line that can be formed during formation of the top build-up layers of the package substrate manufacturing. This results in a trace that avoids coupling to plated through-hole structures in package substrate 112.

In an embodiment, the high-speed I/O trace 134 is disposed near the surface or die side 130 of the IC package substrate 112. "Pinned out near the surface" may mean only a solder mask covers the high-speed I/O trace 134 at the surface 130. It may also mean the high-speed I/O trace 134 is merely exposed as a bond finger through the top layer(s) such as through a solder mask. The high-speed I/O trace 134 significantly also is not electrically coupled to any plated through hole (PTH) in package substrate 112 such that the high-speed I/O path between the IC device 110 and the terminal 136 is not encumbered by any PTH. As a result, high-speed I/O communication may be achieved in a range from 5 Gb/s to 40 Gb/s. The shape and configuration of the electrical terminal 136 depend upon the high speed connector 160 application. For example, a connector requiring a permanent attachment to package substrate 112 will have terminals 136 deposited with solder. If the high speed connector 160 is capable of separation from the substrate 112, the terminals 136 will have a noble surface finish and may be contained under the top surface 130 or protrude from the top surface 130. All these embodiments will be achieved during substrate 112 manufacturing. For example, to create protruding terminals 136, the solder mask in the terminals 136 region (flex-connector region) will not be deposited during the substrate 112 manufacturing.

Figure 2:
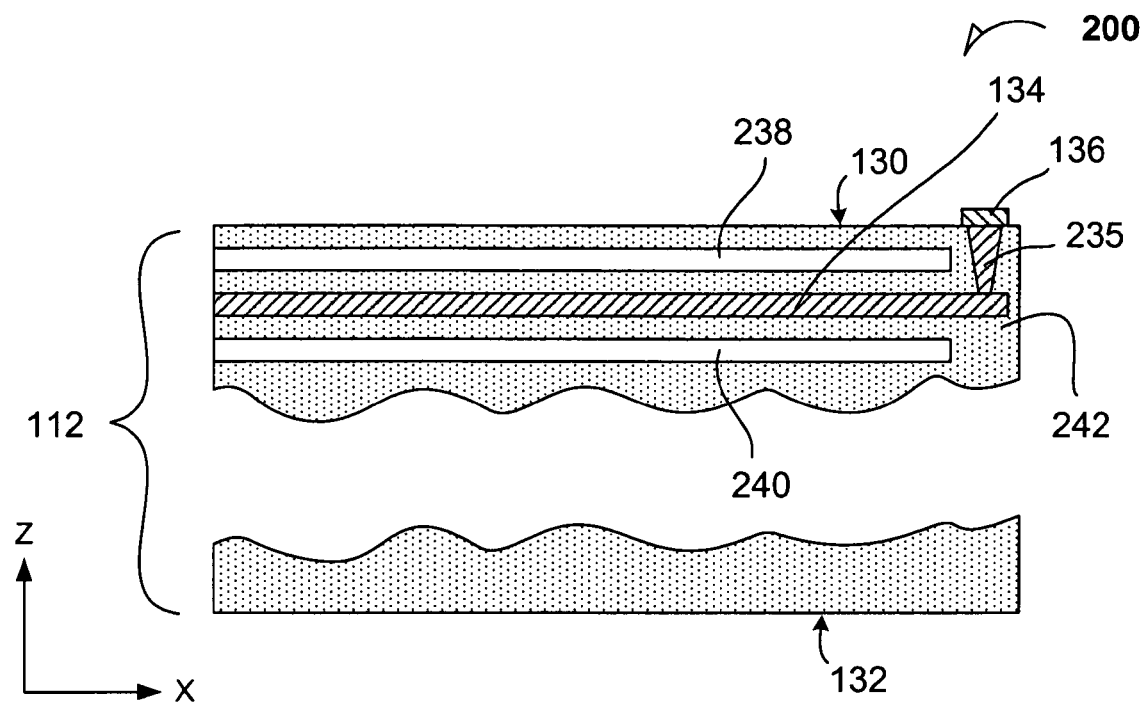
FIG. 2 is a detail section that is taken from the section circle 2 depicted in FIG. 1a according to a stripline trace embodiment.

FIG. 2 is a detail section that is taken from the section circle 2 depicted in FIG. 1a according to a stripline trace embodiment. A stripline trace detail 200 is depicted in FIG. 2 that includes the high-speed I/O trace 134 seen in FIG. 1a but in greater detail. The high-speed I/O trace 134 pins out to the terminal 136 through an interconnect 235 such as a filled via that is not a plated through hole.

In an embodiment, a ground plane 238 is located immediately below the die side 130 of the IC package substrate 112, and a power plane or second ground plane 240 is disposed opposite the ground plane 238 and on the other side of the high-speed I/O trace 134. The high-speed I/O trace 134, the ground plane 238, and the power plane or second ground plane 240 are depicted in simplified form within a dielectric material 242 that is part of the IC package substrate 112. The ground plane 238 and power/ground plane 240 act as a shield and return path configuration to allow for high-speed I/O communications to be sustained within the trace 134. The stripline trace detail 200 may operate in this shielded configuration to allow a data-flow rate from a processor in a range from 5 gigabits per second (Gb/s) to 40 Gb/s. In an embodiment, the stripline trace detail 200 operates in this shielded configuration to allow a data-flow rate from a processor in a range from 10 Gb/s to 12.8 Gb/s.

Figure 3:
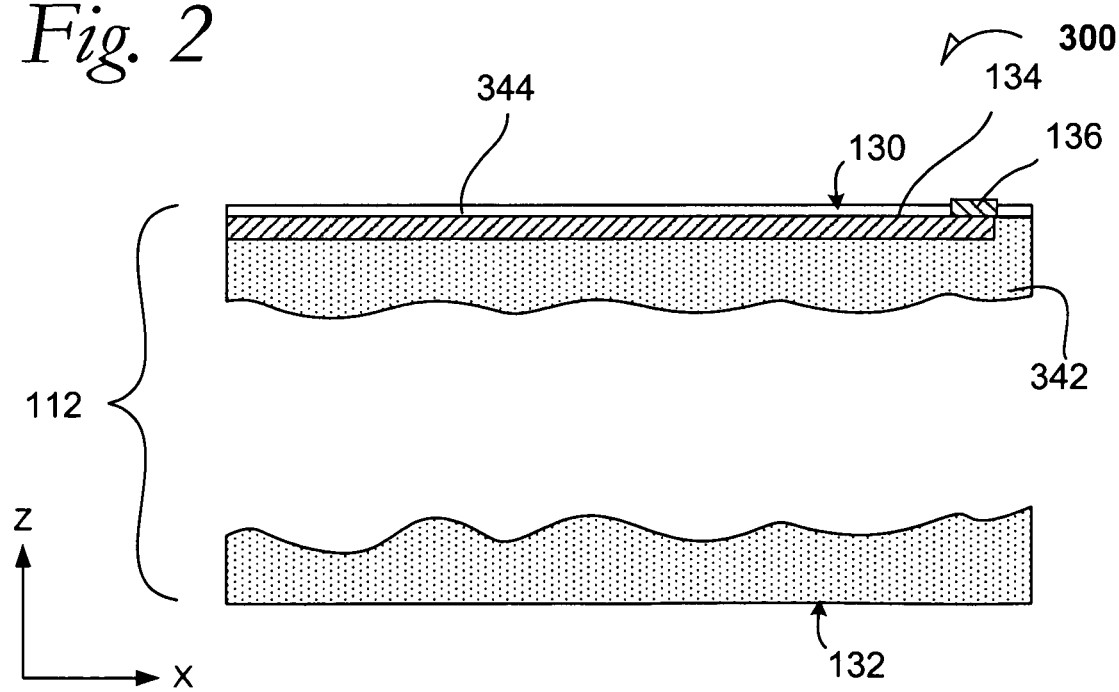
FIG. 3 is a detail section that is taken from the section circle 2 depicted in FIG. 1a according to a microstrip embodiment.

FIG. 3 is a detail section that is taken from the section circle 2 depicted in FIG. 1a according to a microstrip embodiment. A microstrip trace detail 300 is depicted in FIG. 3 that includes the high-speed I/O trace 134 seen in FIG. 1a but in greater detail. The high-speed I/O trace 134 pins out to the terminal 136 that is exposed through a solder mask 344. In this embodiment, the terminal 136 may be a solder bump or other simple electrical conductor that contacts the high-speed I/O trace 134 at a bond finger exposure through the solder mask 344.

In an embodiment, the high-speed I/O trace 134 is located immediately below the solder mask 344 at the die side 130 of the IC package substrate 112. The high-speed I/O trace 134 and the solder mask 344 are depicted in simplified form within a dielectric material 342 that is part of the IC package substrate 112. The microstrip trace detail 300 may operate in this configuration to allow a data-flow rate from a processor in a range from 5 Gb/s to 40 Gb/s. In an embodiment, the microstrip trace 300 operates in this shielded configuration to allow a data-flow rate from a processor in a range from 10 Gb/s to 12.8 Gb/s.

Figure 4:
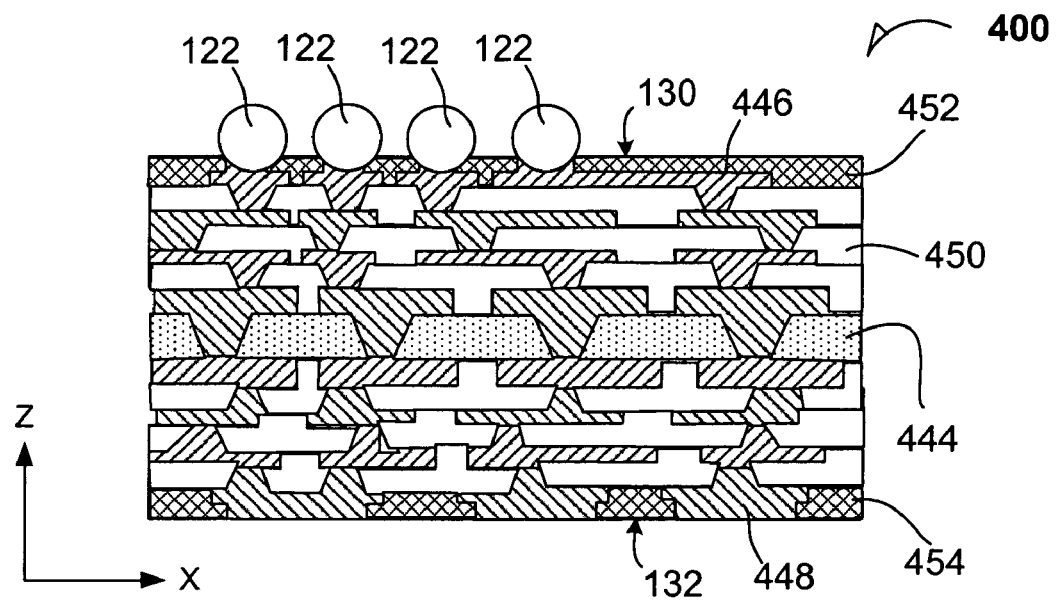
FIG. 4 is a detail cross-section elevation that is taken from the section line 4 depicted in FIG. 1a that illustrates a portion of the integrated circuit package substrate according to a filled via core embodiment.

FIG. 4 is a cross-section elevation detail 400 that is taken from the section line 4 depicted in FIG. 1a that illustrates a portion of the IC package substrate 112 according to a filled via core embodiment. The cross-section elevation illustrates a filled via core detail 400 of the IC package substrate 112. A plurality of the series of electrical bumps 122 is illustrated. In an embodiment, the series of electrical bumps 122 is present on the IC package substrate 112, only with a processor such as the IC device 110. In an embodiment, the series of electrical bumps 122 is present on the IC package substrate 112, only with a memory chip such as the IC device 110. In an embodiment, the series of electrical bumps 122 is present on the IC package substrate 112 such that the bumps 122 are disposed before mating with the IC device 110 such as a processor or a memory chip.

The IC package substrate 112 has a core section 444 that may be a 60 micrometers (μm) thick glass prepreg structure. According to an embodiment, the IC package substrate 112 is also illustrated with several filled vias, one of which is referenced with numeral 446 at the top side 130 and another of which is referenced with numeral 448 at the bottom side 132. The filled via core detail 400 also has several interlayer dielectric (ILD) layers, one of which is referenced with numeral 450. The die side 130 has a solder mask 452 to facilitate insulative reception of the electrical bumps 122. The bottom side 132 also has a solder mask 454 to facilitate insulative connection of components such as the passive components like the LSC 126 depicted in FIG. 1a and/or other components such as the socket 124 in FIG. 1a.

Figure 5:
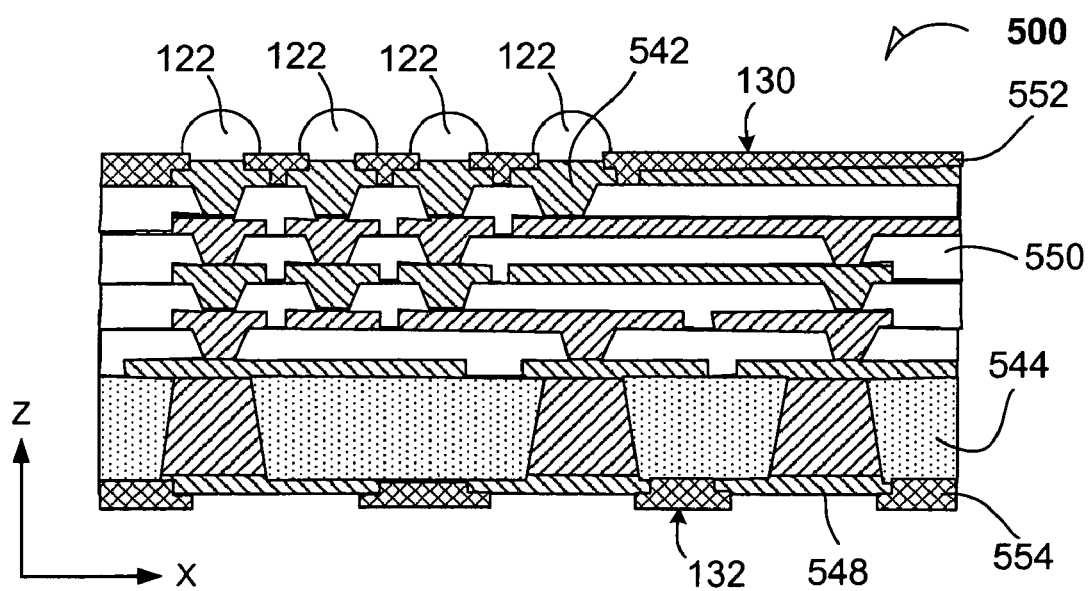
FIG. 5 is a detail cross-section elevation that is taken from the section line 4 depicted in FIG. 1a that illustrates a portion of the integrated circuit package substrate according to a coreless substrate embodiment.

FIG. 5 is a cross-section elevation detail 500 that is taken from the section line 4 depicted in FIG. 1a that illustrates a portion of the IC package substrate 112 according to a coreless substrate embodiment. The cross-section elevation illustrates a coreless substrate detail 500 of the IC package substrate 112. A plurality of the series of electrical bumps 122 is illustrated. In an embodiment, the series of electrical bumps 122 is present on the IC package substrate 112, only with a processor such as the IC device 110. In an embodiment, the series of electrical bumps 122 is present on the IC package substrate 112, only with a memory chip such as the IC device 110. In an embodiment, the series of electrical bumps 122 is present on the IC package substrate 112 such that the bumps 122 are placed before mating with the IC device 110 such as with a processor or a memory chip.

The IC package substrate 112 as depicted has a coreless section 544 that may be a glass prepreg structure. According to an embodiment, the IC package substrate 112 is also illustrated with several filled vias, one of which is referenced with numeral 542 at the top side 130 and another of which is referenced with numeral 548 at the bottom side 132. The coreless substrate detail 500 also has several ILD layers, one of which is referenced with numeral 550. The die side 130 has a solder mask 552 to facilitate insulative reception of the bumps 122. The bottom side 132 also has a solder mask 554 to facilitate insulative connection of components such as the passive components like the LSC 126 depicted in FIG. 1a and/or other components such as the socket 124 in FIG. 1a.

FIG. 6a is a top plan of an IC package substrate 600 according to an example embodiment. The IC package substrate 612 has a top side 630 that illustrates an IHS footprint 618 and a landing zone 610 for an IC device such as a processor or a memory chip. High speed I/O communication is carried out by high-speed I/O traces, one of which indicated in phantom lines with the reference numeral 634 as the high-speed I/O trace is disposed below the top side. The high-speed I/O traces are disposed below the upper structures of the IC package substrate 612, but they are usually configured immediately below the top side 630 such as immediately below a solder mask. The high-speed I/O trace 634 is pinned out at a terminal 636 that is located outside the IHS footprint 618 and it is pinned out on the die side 630. In an embodiment, the high-speed I/O trace 634 is disposed near the surface or die side 630 of the IC package substrate 612.

The terminal 636 is disposed in a terminal array 670 to facilitate high-speed I/O communication between an IC device to occupy the landing zone 610, and a subsequent IC device that may or may not be located on the IC package substrate 612. The terminal array 670 may be located between a terminal array inner perimeter 619 that may correspond to an edge of the IHS footprint 618, and a terminal array outer perimeter 613 that may correspond to the edge of the IC package substrate 612.

The exact number of terminals in a terminal array 670 may be correlated to the total number of I/O terminals needed for a given application. In an embodiment, the total number of I/O terminals is about 400. In an embodiment, the total number of I/O terminals is about 300. In an embodiment, the total number of I/O terminals is about 120 such as for a double-data-rate (DDR) I/O configuration. In an embodiment, the total number of I/O terminals is about 120 such as for a quad-data-rate (QDR) I/O configuration.

Figure 6B:
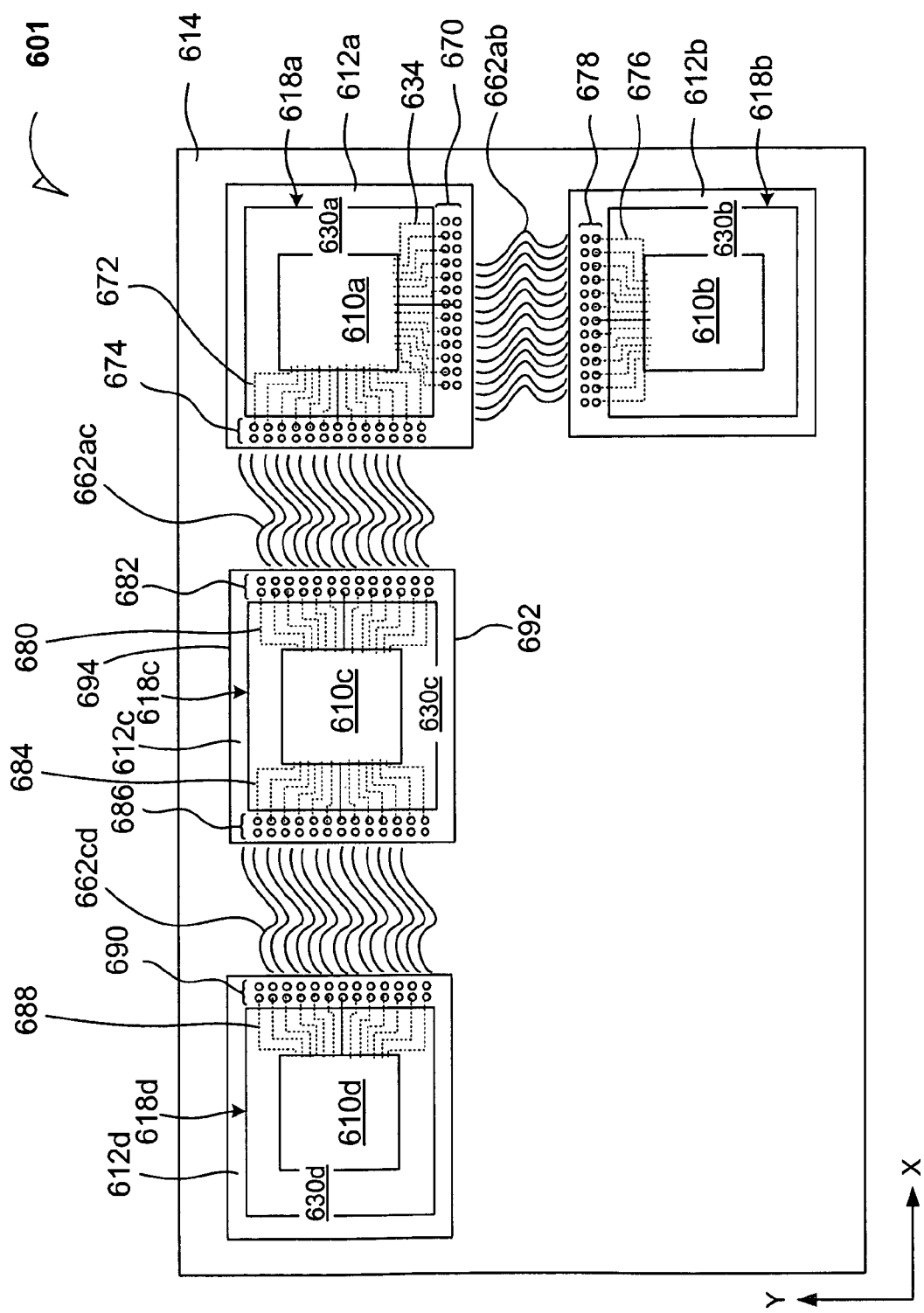
FIG. 6b is a top plan of integrated circuit package substrates disposed on a board according to a method embodiment.

FIG. 6b is a top plan 601 of integrated circuit package substrates disposed on a board 614 according to a method embodiment. An IC package first substrate 612a may include a first landing zone 610a for an IC device such as a first processor. High-speed I/O communication is carried out through high-speed traces, one of which is designated 634. The high-speed trace 634 is represented in phantom lines as it is configured just below the topside 630a. The high-speed trace 634 runs effectively in the Y-direction from the first landing zone 610a to pin out in a terminal array 670 that is outside of a keep-out zone such as an IHS footprint 618a. High-speed I/O communication is also carried out through high-speed traces, one of which is designated 672. The high-speed trace 672 runs effectively in the X-direction from the first landing zone 610a to pin out in a terminal array 674 that is also outside of the keep-out zone 618a. The high-speed trace 672 is also represented in phantom lines as it is configured just below the topside 630a.

An IC package second substrate 612b may include a second landing zone 610b for an IC device such as a second processor that may operate with a first processor (to be disposed at the first landing zone 610a) in a dual-processor configuration according to an embodiment. High-speed I/O communication is carried out within the IC package second substrate 612b through high-speed traces, one of which is designated 676. The high-speed trace 676 is represented in phantom lines as it is configured just below the topside 630b. The high-speed trace 676 runs effectively in the Y-direction and pins out in a terminal array 678 that is outside of a keep-out zone such as an IHS footprint 618b. The IC package first substrate 612a and the IC package second substrate 612b are electrically coupled through a flex ribbon 662ab that is also referred to as a flexible signal-transmission cable 662ab. The flexible signal-transmission cable 662ab may be formed of a polymeric dielectric that has integral conductive traces. The conductive traces in the flexible signal-transmission cable may make electrical contact to the contacts in the terminal arrays 670 and 678. Consequently, high-speed I/O communication is carried out through high-speed I/O traces 634 and 676 and the high-speed I/O communication is not encumbered by plated through-hole couplings.

An IC package third substrate 612c may include a third landing zone 610c for an IC device such as a memory device to be used for storage by the first processor that would be located at the first landing zone 610c. High-speed I/O communication is carried out through high-speed traces, one of which is designated 680. The high-speed trace 680 is represented in phantom lines as it is configured just below the topside 630c. The high-speed trace 680 runs effectively in the X-direction and pins out in a terminal array 682 that is outside of a keep-out zone such as an IHS footprint 618c. High-speed I/O communication is also carried out within the IC package third substrate 612c through high-speed traces, one of which is designated 684. The high-speed trace 684 runs effectively in the X-direction and pins out in a terminal array 686 that is also outside of the keep-out zone 618c. The IC package third substrate 612c and the IC package first substrate 612a are electrically coupled through a flex ribbon 662ac that is also referred to as a flexible signal-transmission cable 662*ac*. Consequently, high-speed I/O communication is carried out through high-speed I/O traces 680 and 684 and the high-speed I/O communication is not encumbered by plated through-hole couplings.

An IC package fourth substrate 612*d* may include a fourth landing zone 610*d* for an IC device such as a memory device providing additional storage for the first processor that would be located at the first landing zone 610*a*. In a dual-processor embodiment, it is noted that the top plan 601 illustrates landing zones for two processors and landing zones for two memory devices, which are coupled in series to the landing zone 610*a* for a first processor. This configuration is to be illustrative only and is not to be limiting. High-speed I/O communication is carried out through high-speed traces, one of which is designated 688. The high-speed trace 688 is represented in phantom lines as it is configured just below the topside 630*d*. The high-speed trace 688 runs effectively in the X-direction and pins out in a terminal array 690 that is outside of a keep-out zone such as an IHS footprint 618*d*. The IC package fourth substrate 612*d* and the IC package third substrate 612*c* are electrically coupled through a flex ribbon 662*cd* that is also referred to as a flexible signal-transmission cable 662*cd*. Consequently, high-speed I/O communication is carried out through high-speed I/O trace 688 and the high-speed I/O communication is not encumbered by plated through-hole couplings.

It may now be understood that arrays may be configured parallel to each other such as the terminal arrays 682 and 686 that are disposed on the IC package third substrate 612*c*. Also, terminal arrays may be configured orthogonally and adjacent to each other such as the terminal arrays 670 and 674 that are disposed on the IC package first substrate 612*a*. Also, a terminal array may occupy only one edge of an IC package substrate such as the terminal array 690 that is disposed on the IC package fourth substrate 612*d*. Although not illustrated, terminal arrays may also occupy three edges of an IC package substrate. For example, the terminal array 670 could be projected onto the IC package third substrate 612*c* along the lower edge 692. Also although not illustrated, terminal arrays may also occupy all four edges of an IC package substrate. For example, the terminal array 670 could be projected onto the IC package third substrate 612*c* along the lower edge 692, and the terminal array 676 could be projected onto the IC package third substrate 612*c* along the upper edge 694.

FIG. 7 is a top plan detail taken from the section circle 7 depicted in FIG. 6*a* according to an example embodiment. In an embodiment, four occurrences of terminals 736 are depicted in a square-pitch terminal array. In an embodiment, the square-pitch terminal array includes two terminals that are configured along a straight line 737 between the terminal array inner perimeter 619 and the terminal array outer perimeter 613.

Figure 8:
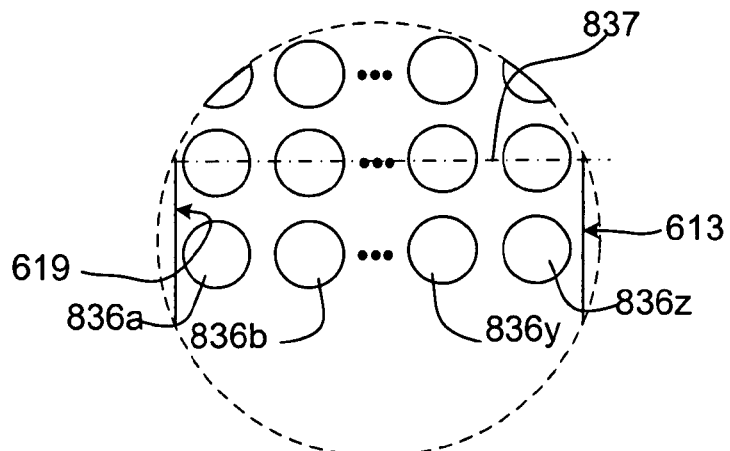
FIG. 8 is a top plan detail taken from the section line 7 depicted in FIG. 6a according to an example embodiment.

FIG. 8 is a top plan detail taken from the section circle 7 depicted in FIG. 6*a* according to an example embodiment. In this embodiment, four occurrences of terminals 836*a*, 836*b*, 836*y*, and 836*z* are disposed in a square-pitch terminal array. The terminal 836*a* may be referred to as a terminal array inner first terminal since it is adjacent the terminal array inner perimeter 619. The terminal 836*b* may be referred to as a terminal array inner subsequent terminal since, although it is not adjacent the terminal array inner perimeter 619, it is nearer to the terminal array inner perimeter 619 than to the terminal array outer perimeter 613 than other terminals. The terminal 836*z* may be referred to as a terminal array outer last terminal because it is adjacent to the terminal array outer perimeter 613. The terminal 836*y* may be referred to as a terminal array outer previous terminal since, although it is not adjacent the terminal array outer perimeter 613, it is nearer to the terminal array outer perimeter 613 than other terminals.

In an embodiment, the number of terminals that may be located in a terminal array may be eight between the terminal array inner perimeter 619 and the terminal array outer perimeter 613. In an embodiment, the eight terminals are configured along a straight line 837 between the terminal array inner perimeter 619 and the terminal array outer perimeter 613, starting with the inner first terminal 836*a* as the first terminal, the inner subsequent terminal 836*b* as the second terminal, the outer previous terminal 836*y* as the seventh terminal, and the outer last terminal 836*z* as the eighth terminal. The number of terminals between inner perimeter 619 and outer perimeter 613 will depend upon number of I/O connections required for an application, spacing between (pitch) the terminals. Thus the number of terminals can be between 1 to 10. in an embodiment, the number of terminals may be seven. In an embodiment, the number of terminals may be six. In an embodiment, the number of terminals may be five. In an embodiment, the number of terminals may be four. In an embodiment, the number of terminals may be three. In an embodiment, the number of terminals may be two. In an embodiment, the number of terminals may be one.

Figure 9:
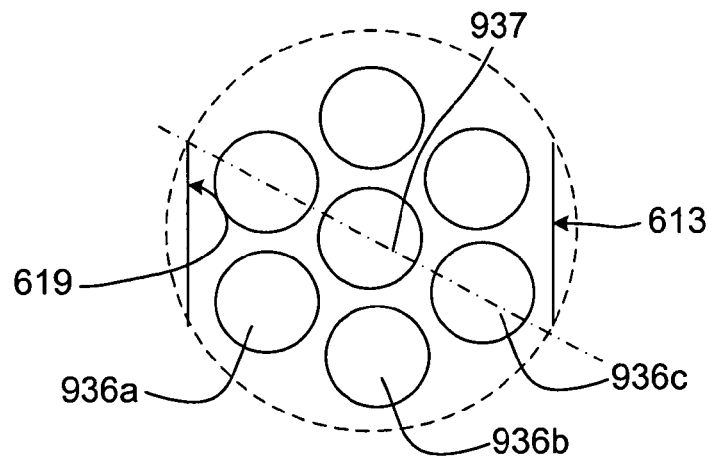
FIG. 9 is a top plan detail taken from the section line 7 depicted in FIG. 6a according to an example embodiment.

FIG. 9 is a top plan detail taken from the section circle 7 depicted in FIG. 6*a* according to an example embodiment. In an embodiment, seven occurrences of terminals 936 are depicted in a hexagonal pitch array. In an embodiment, three occurrences of the terminals are enumerated as a terminal array inner first terminal 936*a*, a terminal array subsequent terminal 936*b*, and a terminal array outer last terminal 936*c*. In an embodiment, a staggered pitch, 2-column array may include the terminal array inner first terminal 936*a* and the terminal array subsequent terminal 936*b*. It may now be understood the total number of terminals located on a straight line 937 between the terminal array outer perimeter 613 and the terminal array inner perimeter 619 in this type of configuration, may be between two and eight according to the specific I/O pin-out needs of a given application. Similarly according to an embodiment, the number of terminals in a terminal array, but located between the terminal array outer perimeter 613 and the terminal array inner perimeter 619 in this type of configuration, may be between 120 and 400.

Figure 10:
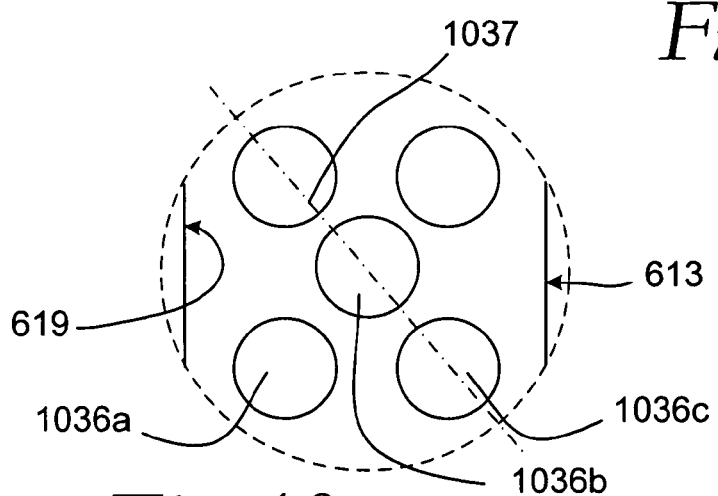
FIG. 10 is a top plan detail taken from the section line 7 depicted in FIG. 6a according to an example embodiment.

FIG. 10 is a top plan detail taken from the section circle 7 depicted in FIG. 6 according to an example embodiment. In an embodiment, five occurrences of terminals 1036 are depicted in a face-centered pitch terminal array. Three occurrences of the terminals are enumerated as a terminal array inner first terminal 1036*a*, a terminal array subsequent terminal 1036*b*, and a terminal array outer last terminal 1036*c*. It may now be understood the total number of terminals located on a straight line 1037 between the terminal array outer perimeter 613 and the terminal array inner perimeter 619 in this type of configuration, may be between two and eight according to the specific I/O pin-out needs of a given application. Similarly according to an embodiment, the number of terminals in a terminal array, but located on a line between the terminal array outer perimeter 613 and the terminal array inner perimeter 619 in this type of configuration, may be between 120 and 400.

Figure 1B:
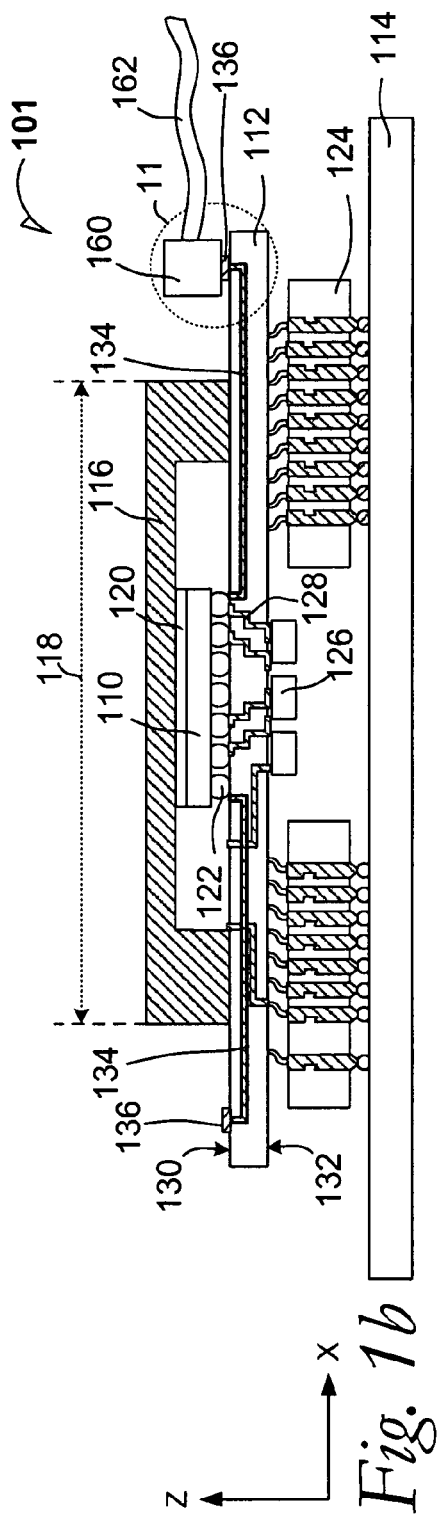
FIG. 1b is a cross-section elevation of the integrated circuit device package depicted in FIG. 1a after further configuration according to an embodiment.

FIG. 1*b* is a cross-section elevation of the integrated circuit device package depicted in FIG. 1*a* after further configuration according to an embodiment. This IC package 101 has been configured with a detachable connector for a flexible cable I/O configuration. The detachable connector may hereinafter be referred to as a high-capacity I/O flex connector 160. The high-capacity I/O flex connector 160 is coupled to a flex ribbon 162 according to an embodiment. In an embodiment, I/O communication through the high-capacity I/O flex connector 160 and flex ribbon 162 is from 5 Gb/s to 40 Gb/s. In an embodiment, the IC package 101 operates in this high-speed I/O trace configuration to allow a data-flow rate from a processor and through the flex ribbon 162 in a range from 10 Gb/s to 12.8 Gb/s.

Figure 11:
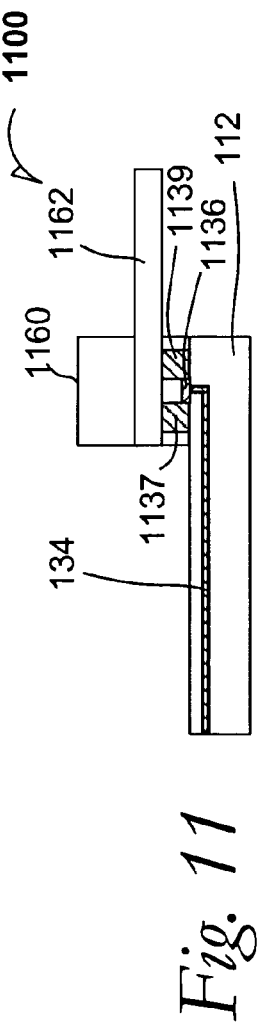
FIG. 11 is a detail section taken from section circle 11 in FIG. 1b according to an example embodiment.

FIG. 11 is a detail section taken from FIG. 1b along the section circle 11 according to an example embodiment. The IC package substrate 112 includes a high-speed I/O trace 134 that is pinned out at a terminal 136. The terminal 1136 is coupled to a high-capacity I/O flex connector 1160. The high-capacity I/O flex connector 1160 includes a terminal contact 1137 and 1139 that electrically contacts the terminal 1136. The high-capacity I/O flex connector 1160 is electrically coupled to a flex ribbon 1162. In an embodiment, I/O communication through the high-capacity I/O flex connector 1160 and flex ribbon 1162 is from 5 Gb/s to 40 Gb/s.

Figure 12:
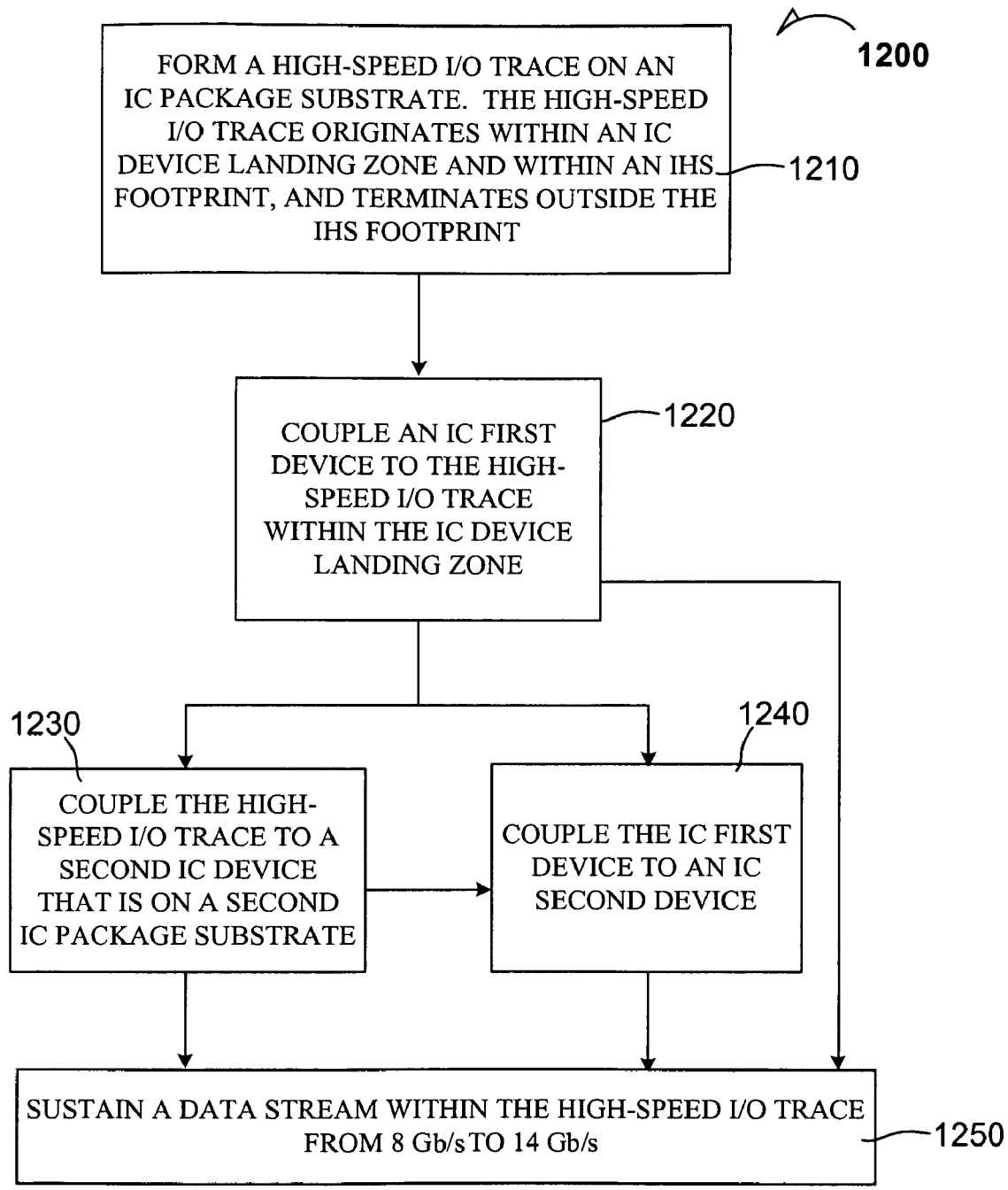
FIG. 12 is a process flow diagram according to an embodiment.

FIG. 12 is a method flow diagram 1200 according to an embodiment.

At 1210, the method includes forming a high-speed I/O trace on an IC package substrate. The high-speed I/O trace is configured to sustain a data stream rate from 8 Gb/s to 14 Gb/s by avoiding any plated through-hole contact. Consequently, the high-speed I/O trace runs from within an IC device footprint to outside an IHS footprint to pin out at a terminal.

At 1220, the method includes coupling an IC first device within the IC device footprint to the high-speed I/O trace. In an example embodiment, an IC first device 110 (see FIG. 1b) is flip-chip mounted on the electrical bumps 122 and the electrical bumps 122 are in contact with the high-speed I/O traces 134. Consequently, the IC first device 110 is coupled within an IC device footprint to the high-speed I/O trace 134.

At 1230, the method includes coupling the high-speed I/O trace on the first IC package substrate to a second IC package substrate. In an example embodiment, the first IC package substrate 612a, which has a high-speed I/O trace 672, is coupled through a flex ribbon 662ac to a second IC package substrate 612c.

At 1240, the method includes coupling the IC first device to an IC second device. In an example embodiment, an IC first device is located at the first landing zone 610a (see FIG. 6b) and an IC second device is located at the second landing zone 610b.

At 1250 the method includes sustaining a data stream in the high-speed I/O trace in a range from 5 Gb/s to 40 Gb/s. This method embodiment includes sustaining this data stream rate by avoiding any plated through-hole couplings for the high-speed I/O traces.

Figure 13:
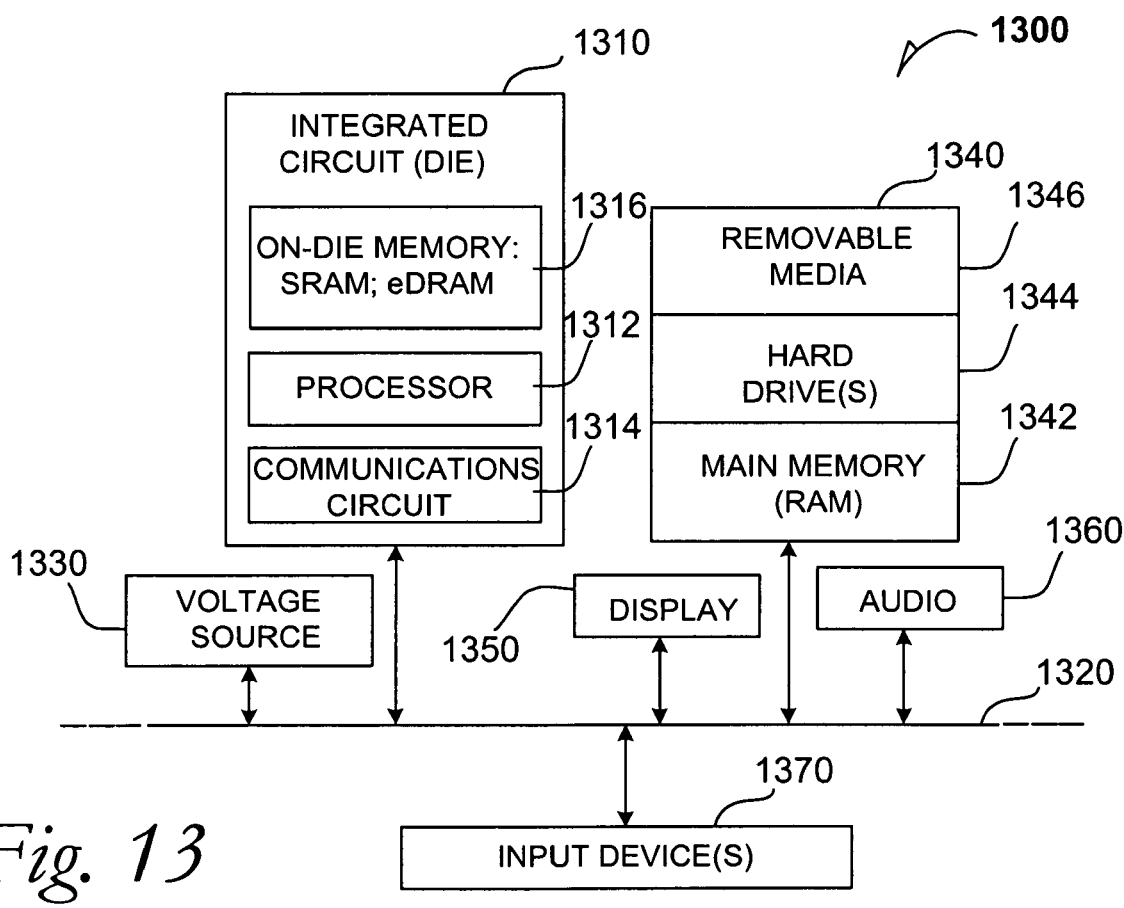
FIG. 13 is a schematic of an electronic system according to an embodiment.

FIG. 13 is a schematic of an electronic system 1300 according to an embodiment. The electronic system 1300 as depicted can embody a high-speed I/O trace that avoids any plated through-hole couplings as set forth in this disclosure. In an embodiment, the electronic system 1300 is a computer system that includes a system bus 1320 to electrically couple the various components of the electronic system 1300. The system bus 1320 is a single bus or any combination of busses according to various embodiments. The electronic system 1300 includes a voltage source 1330 that provides power to the integrated circuit 1310. In some embodiments, the voltage source 1330 supplies current to the integrated circuit 1310 through the system bus 1320.

The integrated circuit 1310 is electrically coupled to the system bus 1320 and includes any circuit, or combination of circuits according to an embodiment. In an embodiment, the integrated circuit 1310 includes a processor 1312 that can be of any type. As used herein, the processor 1312 may mean any type of circuit such as, but not limited to, a microprocessor, a microcontroller, a graphics processor, a digital signal processor, or another processor. Other types of circuits that can be included in the integrated circuit 1310 are a custom circuit or an application-specific integrated circuit (ASIC), such as a communications circuit 1314 for use in wireless devices such as cellular telephones, pagers, portable computers, two-way radios, and similar electronic systems. In an embodiment, the processor 1310 includes on-die memory 1316 such as static random-access memory (SRAM). In an embodiment, the processor 1310 includes embedded on-die memory 1316 such as embedded dynamic random-access memory (eDRAM) that can be a cache memory for the processor.

In an embodiment, the electronic system 1300 also includes an external memory 1340 that in turn may include one or more memory elements suitable to the particular application, such as a main memory 1342 in the form of RAM, one or more hard drives 1344, and/or one or more drives that handle removable media 1346, such as diskettes, compact disks (CDs), digital variable disks (DVDs), flash memory keys, and other removable media known in the art. The various memory functionalities can be coupled to each other through one or more high-speed I/O trace embodiments.

In an embodiment, the electronic system 1300 also includes a display device 1350, an audio output 1360. In an embodiment, the electronic system 1300 includes a controller 1370, such as a keyboard, mouse, trackball, game controller, microphone, voice-recognition device, or any other device that inputs information into the electronic system 1300.

As shown herein, the integrated circuit 1310 can be implemented in a number of different embodiments, including a high-speed I/O trace that avoids any plated through-hole couplings, an electronic system, a computer system, one or more methods of fabricating an integrated circuit, and one or more methods of fabricating an electronic assembly that includes a high-speed I/O trace that avoids any plated through-hole couplings as set forth herein in the various embodiments and their art-recognized equivalents. The elements, materials, geometries, dimensions, and sequence of operations can all be varied to suit particular I/O coupling requirements including array contact count, array contact configuration, such as single-edge, double-edge, triple-edge, and all four edges being occupied by contacts that are coupled to high-speed I/O traces that avoid any plated through-hole couplings.

Figure 14:
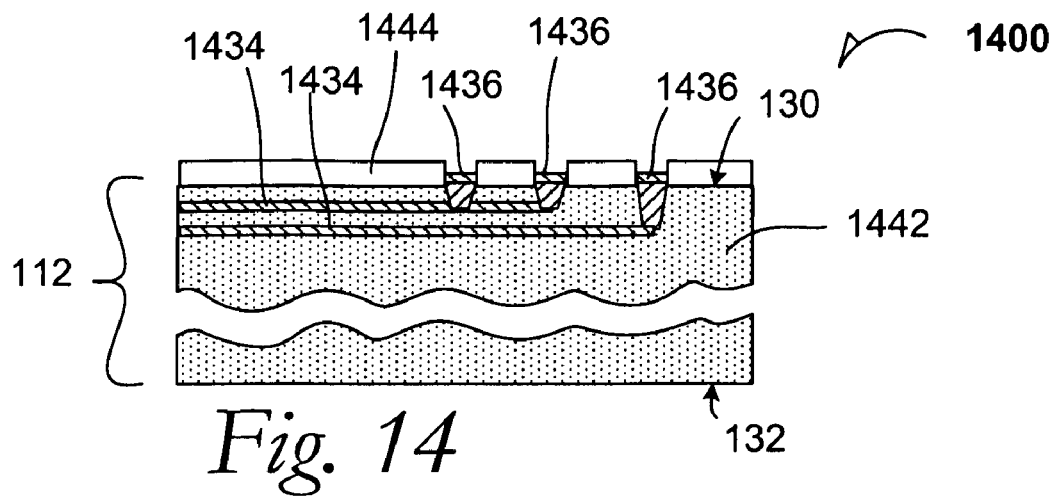
FIG. 14 is a detail section that is taken from the section circle 2 depicted in FIG. 1a according to a solder-mask open embodiment.

FIG. 14 is a detail section that is taken from the section circle 2 depicted in FIG. 1a according to a solder mask pad-defined embodiment. A solder mask pad-defined detail 1400 is depicted in FIG. 14 that includes high-speed I/O traces 1434 that may appear in FIG. 1a but in greater detail. The high-speed I/O traces 1434 pin out to the terminal 1436 that are exposed through a solder mask 1444. In this embodiment, the terminals 1436 are defined in unit area by the presence and patterning of the solder mask 1444 such that the terminals 1436 contact the high-speed I/O traces 1434 at an exposure through the solder mask 1444. In other words, the solder-mask open (SMO) defines the pad area on a flex-connector region of the IC package substrate 112.

The high-speed I/O traces 1434 and the solder mask 1444 are depicted in simplified form within a dielectric material 1442 that is part of the IC package substrate 112. The solder mask pad-defined detail 1400 may operate in this configuration to allow a data-flow rate from a processor in a range from 5 Gb/s to 40 Gb/s. In an embodiment, the solder mask pad-defined detail 1400 operates in this configuration to allow a data-flow rate from a processor in a range from 10 Gb/s to 12.8 Gb/s.

Figure 15:
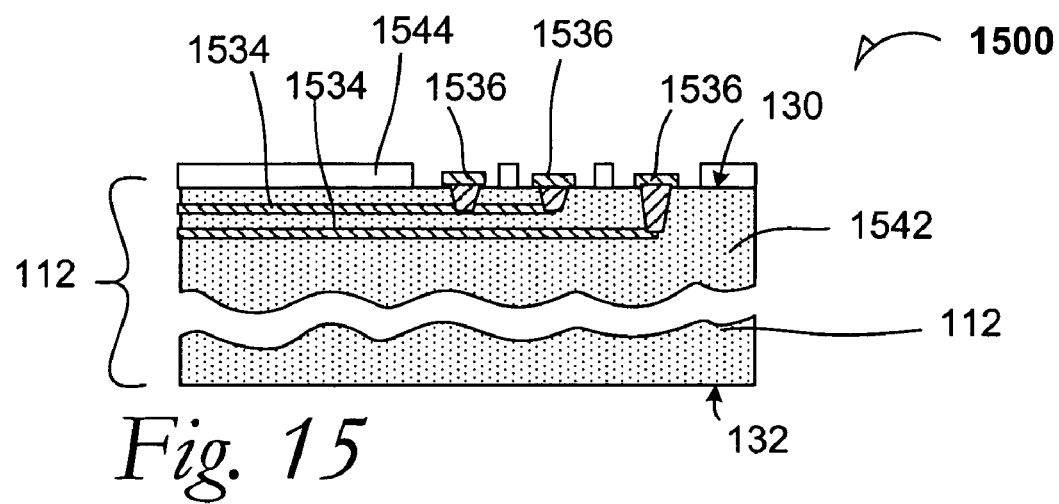
FIG. 15 is a detail section that is taken from the section circle 2 depicted in FIG. 1a according to a large solder-mask open embodiment.

FIG. 15 is a detail section that is taken from the section circle 2 depicted in FIG. 1a according to a non-solder mask pad-defined embodiment. A non-solder mask pad-defined detail 1500 is depicted in FIG. 15 that includes high-speed I/O traces 1534 that may appear in FIG. 1a but in greater detail. The high-speed I/O traces 1534 pin out to the terminal 1536 that are exposed through a solder mask 1544. In this embodiment, the size of the terminals 1536 is not defined in unit area by the presence and patterning of the solder mask 1544, other than the unit are is smaller than the solder mask open (SMO) area such that the terminals 1536 contact the high-speed I/O traces 1534 at exposure areas through the solder mask 1544 that is smaller than the SMOs. In other words, the SMO defines an area greater than the pad area on a flex-connector region of the IC package substrate 112.

The high-speed I/O traces 1534 and the solder mask 1544 are depicted in simplified form within a dielectric material 1542 that is part of the IC package substrate 112. The non-solder mask pad-defined detail 1500 may operate in this configuration to allow a data-flow rate from a processor in a range from 5 Gb/s to 40 Gb/s. In an embodiment, the non-solder mask pad-defined detail 1500 operates in this configuration to allow a data-flow rate from a processor in a range from 10 Gb/s to 12.8 Gb/s.

Figure 16:
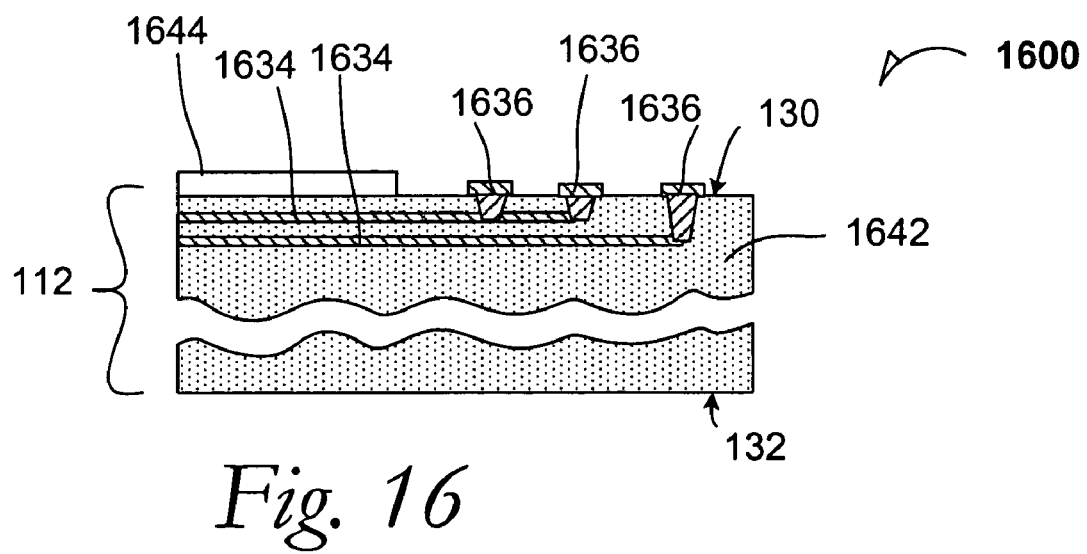
FIG. 16 is a detail section that is taken from the section circle 2 depicted in FIG. 1a according to a regional solder-mask open embodiment.

FIG. 16 is a detail section that is taken from the section circle 2 depicted in FIG. 1a according to a regional solder-mask open (RSMO) defined embodiment. An RSMO is an area in the region of the surface of the substrate where no solder mask is present. The area can be from one to four keep-out zones around the periphery of the substrate. An RSMO detail 1600 is depicted in FIG. 16 that includes high-speed I/O traces 1634 that may appear in FIG. 1a but in greater detail. The high-speed I/O traces 1634 pin out to the terminals 1636 that are regionally exposed through a solder mask 1644.

The high-speed I/O traces 1634 and the solder mask 1644 are depicted in simplified form within a dielectric material 1642 that is part of the IC package substrate 112. The RSMO detail 1600 may operate in this configuration to allow a data-flow rate from a processor in a range from 5 Gb/s to 40 Gb/s. In an embodiment, the RSMO 1600 operates in this configuration to allow a data-flow rate from a processor in a range from 10 Gb/s to 12.8 Gb/s.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An input/output (I/O) package architecture for an integrated circuit package substrate, comprising:
   an integrated circuit (IC) package substrate including an integrated heat spreader (IHS) footprint on a die-side thereof; and
   an I/O trace to couple with an IC device to be disposed inside the IHS footprint, wherein the I/O trace includes a pin-out terminal outside the IHS footprint to couple to an IC device to be disposed outside the IHS footprint, and wherein the I/O trace is capable of transmitting data between an IC device to be mounted inside the IHS footprint and an IC device to be located outside the IHS footprint at a signal rate between 5 Gb/s and 40 Gb/s.

2. The I/O architecture of claim 1, wherein the pin-out terminal is disposed on the IC package substrate die side.

3. The I/O architecture of claim 1, wherein the I/O trace is an integral metal line.

4. The I/O architecture of claim 1, wherein the I/O trace includes a shielded stripline.

5. The I/O architecture of claim 1, wherein the I/O trace includes a microstrip disposed on the IC device package substrate die side.

6. The I/O architecture of claim 1, wherein the I/O trace is an I/O first trace, and wherein the pin-out terminal is a pin-out first terminal, the I/O architecture further including:
   an I/O second trace to couple the IC device to be disposed inside the IHS footprint;
   a pin-out second terminal outside the IHS footprint to couple to an IC device to be located outside the IHS footprint, and wherein the pin-out first terminal and the pin-out second terminal are disposed parallel to an edge of the processor mounting substrate.

7. The I/O architecture of claim 1, wherein the pin-out terminal is part of a first terminal array, and wherein the first terminal array is configured along an edge of the IC package substrate.

8. The I/O architecture of claim 1, wherein the pin-out terminal is part of a first terminal array, and wherein the first terminal array has a pin-out terminal layout selected from square pitch, staggered pitch, hexagonal pitch, and face-centered pitch.

9. The I/O architecture of claim 1, wherein the pin-out terminal is part of a first terminal array, wherein the first terminal array is configured along an edge of the IC package substrate, the I/O architecture further including:
   a second terminal array disposed along a second edge of the IC package substrate.

10. The I/O architecture of claim 1, wherein the pin-out terminal is part of a first terminal array, wherein the first terminal array is configured along an edge of the IC package substrate, the I/O architecture further including:
    a second terminal array disposed along a second edge of the IC package substrate, and wherein the first terminal array and the second terminal array are disposed at parallel edges of the IC package substrate.

11. The I/O architecture of claim 1, wherein the pin-out terminal is part of a first terminal array, wherein the first terminal array is configured along an edge of the IC package substrate, the I/O architecture further including:
    a second terminal array disposed along a second edge of the IC package substrate, and wherein the first terminal array and the second terminal array are disposed at orthogonal adjacent edges of the IC package substrate.

12. The I/O architecture of claim 1, wherein the pin-out terminal is part of a first array of pin-out terminals, wherein the first array is configured along an edge of the IC device substrate, the I/O architecture further including:
- a second array disposed along a second edge of the IC device substrate; and
- a third array disposed along a third edge of the IC device substrate.

13. The I/O architecture of claim 1, wherein the pin-out terminal is part of a first terminal array, wherein the first terminal array is configured along an edge of the IC package substrate, the I/O architecture further including:
- a second terminal array disposed along a second edge of the IC package substrate;
- a third terminal array disposed along a third edge of the IC package substrate; and
- a fourth terminal array disposed along a fourth edge of the IC package substrate.

14. An input/output (I/O) package architecture for an integrated circuit package substrate, comprising:
- an integrated circuit (IC) package substrate including an integrated heat spreader (IHS) footprint on a die-side thereof; and
- an I/O trace to couple with an IC device to be disposed inside the IHS footprint, wherein the I/O trace includes a pin-out terminal outside the IHS footprint to couple to an IC device to be disposed outside the IHS footprint, and wherein the pin-out terminal is a detachable connector terminal for a flexible signal-transmission cable.

15. The I/O package architecture of claim 14, wherein the I/O trace is capable of transmitting data between an IC device to be disposed inside the IHS footprint and an IC device active device to be located outside the IHS footprint at a rate between 5 Gb/s and 40 Gb/s, wherein the pin-out terminal is a detachable connector terminal for a flexible signal-transmission cable, wherein the pin-out terminal is disposed on the IC package substrate die side, and wherein the I/O trace is an integral metal line.

16. The I/O architecture of claim 14, wherein the pin-out terminal is disposed on the IC package substrate die side.

17. The I/O architecture of claim 14, wherein the I/O trace is an integral metal line.

18. The I/O architecture of claim 14, wherein the I/O trace includes a shielded stripline.

19. The I/O architecture of claim 14, wherein the I/O trace includes a microstrip disposed on the IC device package substrate die side.

20. The I/O architecture of claim 14, wherein the I/O trace is an I/O first trace, and wherein the pin-out terminal is a pin-out first terminal, the I/O architecture further including:
- an I/O second trace to couple the IC device to be disposed inside the IHS footprint;
- a pin-out second terminal outside the IHS footprint to couple to an IC device to be located outside the IHS footprint, and wherein the pin-out first terminal and the pin-out second terminal are disposed parallel to an edge of the processor mounting substrate.

21. An input/output (I/O) package architecture for an integrated circuit package substrate, comprising:
- an integrated circuit (IC) package substrate including an integrated heat spreader (IHS) footprint on a die-side thereof;
- an I/O trace to couple with an IC device to be disposed inside the IHS footprint, wherein the I/O trace includes a pin-out terminal outside the IHS footprint to couple to an IC device to be disposed outside the IHS footprint; and
- wherein the pin-out terminal is defined by a factor of an open area in a solder mask disposed on the IC package.

22. The I/O package architecture of claim 21, wherein the pin-out terminal includes an exposed area that equals the open area in the solder mask.

23. The I/O package architecture of claim 21, wherein the pin-out terminal includes an exposed area that is smaller than the open area in the solder mask.

24. The I/O package architecture of claim 21, wherein the pin-out terminal includes an exposed area devoid of solder mask and that is present along from one to four keep-out zones on the substrate.

25. The I/O package architecture of claim 21, wherein the I/O trace is capable of transmitting data between an IC device to be mounted inside the IHS footprint and an IC device to be located outside the IHS footprint at a signal rate between 5 Gb/s and 40 Gb/s.

26. The I/O architecture of claim 21, wherein the pin-out terminal is a detachable connector terminal for a flexible signal-transmission cable.

27. The I/O architecture of claim 21, wherein the pin-out terminal is disposed on the IC package substrate die side.

28. The I/O architecture of claim 21, wherein the I/O trace is an integral metal line.

29. An input/output (I/O) package architecture for an integrated circuit package substrate, comprising:
- an integrated circuit (IC) package substrate including an integrated heat spreader (IHS) footprint on a die-side thereof;
- an I/O first trace to couple with an IC device to be disposed inside the IHS footprint, wherein the I/O first trace includes a pin-out first terminal outside the IHS footprint to couple to an IC device to be disposed outside the IHS footprint;
- an I/O second trace to couple the IC device to be disposed inside the IHS footprint;
- a pin-out second terminal outside the IHS footprint to couple to an IC device to be located outside the IHS footprint, and wherein the pin-out first terminal and the pin-out second terminal are disposed parallel to an edge of the processor mounting substrate,
- wherein the pin-out first terminal and the pin-out second terminal are part of a first terminal array, and wherein the first terminal array is configured along an edge of the IC package substrate, and
- wherein the first terminal array is configured along an edge of the IC package substrate.

30. The I/O architecture of claim 29, further including:
- a second terminal array disposed along a second edge of the IC package substrate, wherein the first terminal array and the second terminal array are disposed at parallel edges of the IC package substrate.

31. The I/O architecture of claim 29, further including:
- a second terminal array disposed along a second edge of the IC package substrate, and wherein the first terminal array and the second terminal array are disposed at orthogonal adjacent edges of the IC package substrate.

32. The I/O architecture of claim 29, further including:
- a second terminal array disposed along a second edge of the IC device substrate; and
- a third terminal array disposed along a third edge of the IC device substrate.

33. The I/O architecture of claim 29, further including:
- a second terminal array disposed along a second edge of the IC package substrate;
- a third terminal array disposed along a third edge of the IC package substrate; and
- a fourth terminal array disposed along a fourth edge of the IC package substrate.

34. An input/output (I/O) package architecture for an integrated circuit package substrate, comprising:
- an integrated circuit (IC) package substrate including an integrated heat spreader (IHS) footprint on a die-side thereof;
- an I/O first trace to couple with an IC device to be disposed inside the IHS footprint, wherein the I/O first trace includes a pin-out first terminal outside the IHS footprint to couple to an IC device to be disposed outside the IHS footprint;
- an I/O second trace to couple the IC device to be disposed inside the IHS footprint;
- a pin-out second terminal outside the IHS footprint to couple to an IC device to be located outside the IHS footprint, and wherein the pin-out first terminal and the pin-out second terminal are disposed parallel to an edge of the processor mounting substrate,
- wherein the pin-out first terminal and the pin-out second terminal are part of a first terminal array, and wherein the first terminal array is configured along an edge of the IC package substrate, and
- wherein the first terminal array is configured along an edge of the IC package substrate.

35. The I/O architecture of claim 34, wherein the I/O first trace is capable of transmitting data between an IC device to be disposed inside the IHS footprint and an IC device active device to be located outside the IHS footprint at a rate between 5 Gb/s and 40 Gb/s, wherein the pin-out terminal is a detachable connector terminal for a flexible signal-transmission cable, wherein the pin-out first terminal is disposed on the IC package substrate die side, and wherein the I/O first trace is an integral metal line.

* * * * *